Sept. 5, 1972 T. D. BUNKER ET AL 3,689,336
FABRICATION OF PACKAGES FOR INTEGRATED CIRCUITS
Filed Jan. 4, 1971 2 Sheets-Sheet 1
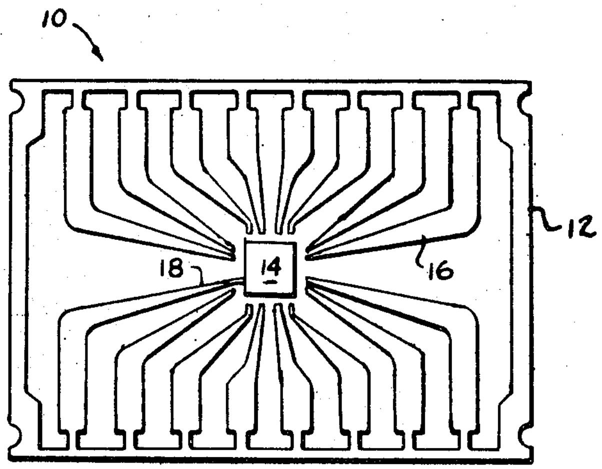
Fig. 1
PRIOR ART
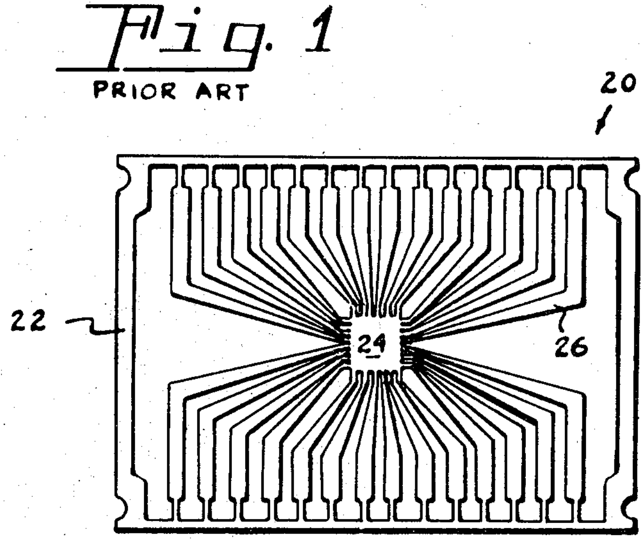
Fig. 2
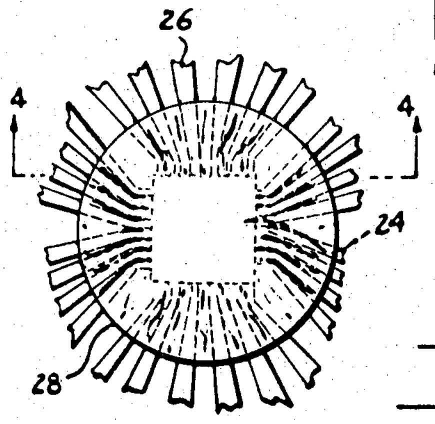
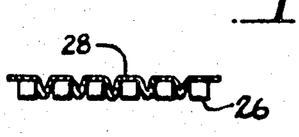
Fig. 4
Fig. 3

Sept. 5, 1972 T. D. BUNKER ET AL 3,689,336

FABRICATION OF PACKAGES FOR INTEGRATED CIRCUITS

Filed Jan. 4, 1971 2 Sheets-Sheet 2

3,689,336

FABRICATION OF PACKAGES FOR INTEGRATED CIRCUITS

Thomas D. Bunker, Bradford, and David F. Thompson, Warren, Pa., assignors to Sylvania Electric Products, Inc.

Filed Jan. 4, 1971, Ser. No. 103,512
Int. Cl. C03b 29/00; B01j 17/00; H05k 5/00
U.S. Cl. 156—89 7 Claims

ABSTRACT OF THE DISCLOSURE

A process useful for fabricating articles having a ceramic hermetic sealing member and a high density of relatively thin electrically conductive leads comprising fabricating an electrically conductive member having a frame portion extending around the perimeter thereof and a relatively small central pad portion connected to two opposing sides frame portion by a plurality of component leads and at least one connecting lead, applying a heat decomposable adhesive suitable for bonding a metal foil to the pad and to a segment of each of the component leads and the connecting lead, compacting a metal foil over the coated pad and the coated segment of the leads and into the spacing between the leads, severing the component leads adjacent to the pad, forming a ceramic hermetic seal, by the application of heat, around a substantial portion of all of the leads between the foil and the frame and removing the foil and the decomposition products of the adhesive.

BACKGROUND OF THE INVENTION

This invention relates to a method of fabricating articles having a ceramic hermetic seal. More particularly, it relates to a method particularly suitable for fabricating integrated circuit (IC) packages having a relatively high density of leads at the central pad that forms a support bed for the active component normally a semiconductor chip.

Integrated circuit packages having a metal-ceramic hermetic seal are known. The packages heretofore generally consisted of a lead frame that had a frame portion extending around the perimeter thereof and a central pad portion normally having a surface of about 190 mils by 190 mils to form a bed for the component such as a semiconductor chip. A number of leads normally extend from two opposing sides of the frame portion toward the pad portion. The center-to-center spacing of the leads at the two sides of the frame portion is normally about 50 or about 100 mils. In most instances, the lead frame was fabricated by metal stamping with only one lead connected to the pad and the remaining leads spaced apart from the pad by a predetermined pattern such as about 20 mils. The leads were fabricated so that all four sides of the pad surface were covered, however, the available space around the perimeter of the pad was less than one linear inch. When a relatively small number of leads were required, such as 20 or below, the lead density close to the central pad portion was not high enough to create problems when the lead frame was fabricated by normal metal stamping techniques. The center-to-center spacing of the leads adjacent to the pad could be relatively wide such as above about 20 mils. This created no appreciable problems in stamping the lead frames. Recently, however, there has been an increasing demand for more leads per package. As can be appreciated as the number of leads increased the width of the leads adjacent to the pad was correspondingly decreased. As a relatively high density was reached as the number of leads increased above about 20, problems occurred in stamping because of vertical and horizontal deformation resulting from mechanical handling and heat warpage. Maintaining lead alignment during fabrication of the seal became a significant problem.

It is believed, therefore, a method of fabricating hermetically sealed intermediate IC packages when there is a relatively high lead density that overcomes lead alignment problems would be an advancement in the art.

OBJECTS AND SUMMARY OF THE INVENTION

It is an object of this invention to provide a process for manufacturing packages having a ceramic seal where alignment of relatively thin metal parts is required.

It is an additional object of this invention to provide a method of fabricating hermetically sealed IC packages having a relatively high lead density.

In accordance with one aspect of this invention there is provided a process comprising fabricating an electrically conductive member comprising a frame portion extending around the perimeter of the member and a central pad portion having a plurality of component leads and a connecting lead extending from each of the sides to the frame portion, applying a heat decomposable adhesive, suitable for bonding a metal foil to the metallic member, over one side of the central pad and a segment of each of the leads adjacent to the pad, placing a metal foil over the adhesive coated portion and compacting it sufficiently to extend the foil in between the leads, drying the adhesive to bond the foil to the coated portion, severing a portion of the component leads from the pad, forming a ceramic member, by the application of heat that provides a hermetic seal around a substantial portion of the leads between the central pad and the frame portion and providing a ceramic support for the coated portion on the opposing side from the metal foil and thereafter removing the foil and any adhesive decomposition products.

BRIEF DESCRIPTION OF THE DRAWINGS

FIG. 1 is a plan view of a lead frame manufactured by the prior art method.

FIG. 2 is a plan view of a lead frame manufactured according to the present invention.

FIG. 3 is a detail plan view of a segment of the article during processing.

FIG. 4 is a detail elevation view of a segment taken along the axis 4—4 of FIG. 3.

DESCRIPTION OF THE PREFERRED EMBODIMENTS

Figure 5:
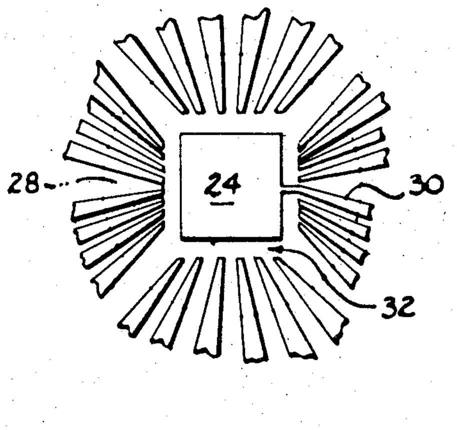
FIG. 5 is a detailed plan view of a segment of the article prior to forming the metallic ceramic seal.

For a better understanding of the present invention, together with other and further objects, advantages, and capabilities thereof, reference is made to the following disclosure and appended claims in connection with the above-described drawings.

Referring now to the drawings with greater particularity, in FIG. 1 there is shown an electrically conductive metal member made by prior art techniques, designated generally as 10, comprising a frame portion 12 extending around the perimeter, a relatively small central pad portion 14, a plurality of electrically conductive component leads, of which one lead 16 is typical, and a single connecting lead 18 that extends from the central pad 14 to the frame portion 12. When the number of total leads is relatively small, such as sixteen as shown, the leads could be severed from the central pad 14 during fabrication without alignment problems.

In FIG. 2, there is shown an electrically conductive metal member generally designated as 20, fabricated in accordance with the invention which comprises a frame portion 22, a central pad portion 24, a plurality of leads, of which one lead 26 is typical, that extend from the pad portion 24 to the frame portion 22. As the number of leads increases above about twenty such as twenty-eight in the member illustrated, the lead density adjacent to the pad portion 24 becomes quite high. If all were severed except one as in the prior art, the leads 26 would not maintain alignment.

With particular reference to FIGS. 3 and 4, a detailed segment of the pad portion 24 and the portion of the leads 26 adjacent to the pad portion 24 are shown. A heat decomposable adhesive, such as a silicon adhesive sold under the trade name of X–30483 by Dow Corning Corporation, not shown, suitable for bonding metal foil is applied to the pad 24 and a segment of leads 26 adjacent thereto. Although a silicone adhesive is used, any metal bonding adhesive that will decompose or evolve at firing temperatures of the adhesive such as below 600° C. can be used. A metal foil 28 is placed over the foil and compacted between the leads 26 as illustrated in FIG. 4. The foil is bonded to the metal portion by the adhesive. Generally, relatively thin metal foil such as those having a thickness generally about 1 mil are suitable. Any metal that is stable up to about 1000° C. is satisfactory.

FIG. 5 is a detailed plan view of the same segment of the electrically conductive member shown in FIG. 3 except that the subsequent processing step has been completed. In this step a predetermined amount of the foil 28 and all but one lead 30 is removed to provide a spacing 32 between the pad 24 and the rest of the leads. The remaining foil 28 holds the leads in alignment. The exact width of the spacing 32 will vary depending upon the ultimate component (not shown) that is placed upon the pad and the means selected to provide electrical contact between the leads and the component. Additionally, in this embodiment only one lead 30 is left connected. Although one connecting lead is essential, more than one can be used although generally not more than one is left connected since it is desired to obtain as many component circuits as is possible in a given package.

Figures 6, 7:
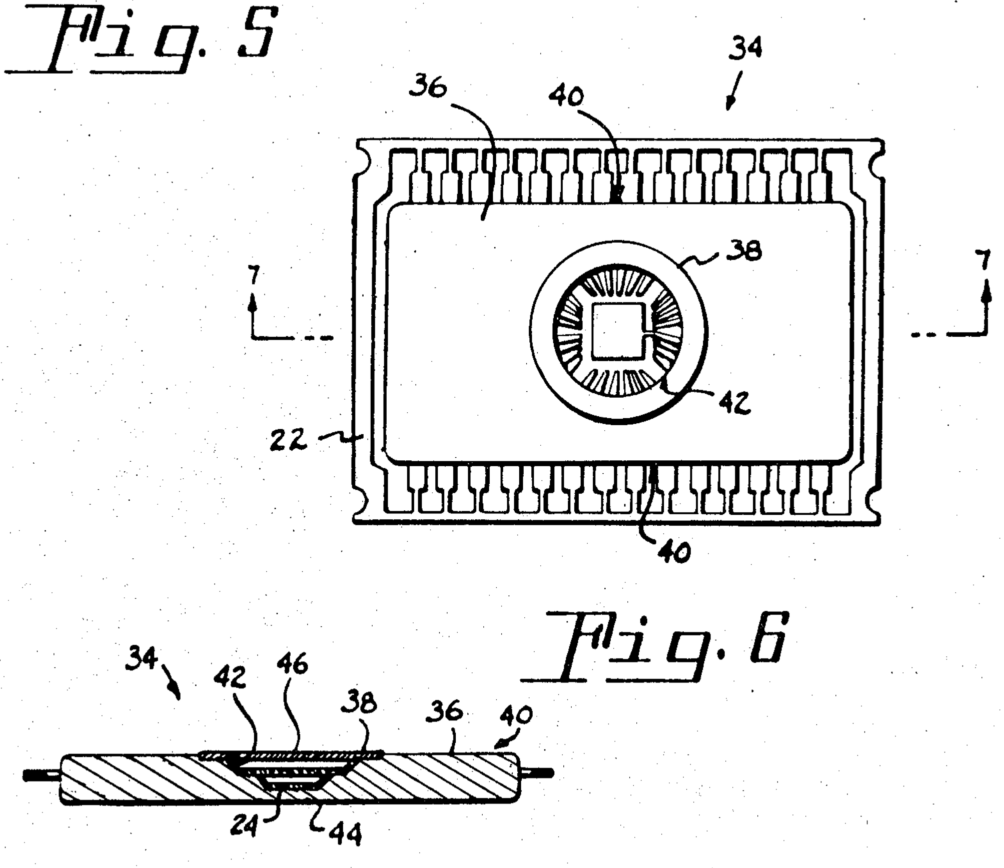
FIG. 6 is a detailed plain view of the article manufactured by this invention.
FIG. 7 is an elevational view of the article of FIG. 6 along line 7—7 of FIG. 6.

With particular reference to FIGS. 6 and 7 which show the final package, generally designated at 34, the ceramic portion 36 in conjunction with the metal washer insert 38 provides several functions. The ceramic portion 36 is cast by conventional ceramic molding techniques to provide a package which has the leads extending through the outer seal 40 to enable their subsequent connection to an electric circuit after frame portion 22 has been removed. The leads also extend through the inner seal 42 to enable their subsequent connection to an integrated circuit component such as a semiconductor chip. Support for the leads and for the pad 24 in the central portion 42 is provided by molding the ceramic so that the side 44 opposing the side containing the opening 46, shown in FIG. 7, is continuous. A hermetic seal is formed covering a large portion of the leads since the ceramic during molding forms a ceramic seal. During the ceramic forming operation the adhesive that binds to the foil 28 leads and to the pad is decomposed. The foil 28 can be removed easily and lead alignment is maintained. The ceramic seal 42 holds the leads in alignment after removal of the foil. After washing with any suitable solvent to remove residue or adhesive decomposition products, the package is essentially complete for use by inserting the IC component.

While there have been shown and described what are at present considered the preferred embodiments of the invention, it will be obvious to those skilled in the art that various changes and modifications may be made therein without departing from the scope of the invention as defined by the appended claims.

What is claimed is:

1. A process useful for fabricating articles having a ceramic hermetic sealing member and a relatively high density of relatively thin electrically conductive leads at the central portion thereof said process comprising:

(a) fabricating an electrically conductive member comprising a frame portion extending around the perimeter thereof, a central pad portion, a plurality of electrically conductive component leads and at least one connecting lead, said leads being individually connected to said pad portion and said frame portion, (b) applying a layer of heat decomposable adhesive suitable for bonding a metal foil to the pad and to a segment of each of said component leads and to said connecting lead, (c) compacting a metal foil over said layer of adhesive and into voids between said leads, (d) severing said component leads adjacent to said pad portion, (e) forming said ceramic hermetic sealing member by the application of heat around a substantial portion of all of said leads between said foil and said frame portion, and (f) removing said foil and any decomposition products of said adhesive.

2. A process according to claim 1 wherein the number of leads is greater than abont 20.

3. A process according to claim 2 wherein said frame portion is substantially rectangular and said leads extend to two opposing sides of said frame.

4. A process according to claim 3 wherein said leads have a center-to-center spacing of about 50 mils at said frame portion.

5. A process according to claim 3 wherein said leads have a center-to-center spacing of about 100 mils at said frame portion.

6. A process according to claim 3 wherein said adhesive is a silicone adhesive.

7. A process according to claim 3 wherein said metal foil has a thickness of about 1 mil and is a stable metal at temperatures of up to 1000° C.

References Cited

UNITED STATES PATENTS

| | | | |
|---|---|---|---|
| 3,484,533 | 12/1969 | Kauffman | 29—589 |
| 3,537,175 | 11/1970 | St. Clair et al. | 29—590 |

DOUGLAS J. DRUMMOND, Primary Examiner

U.S. Cl. X.R.

156—155, 250; 29—589; 174—525, DIGEST 3